United States Patent [19]
Gardner et al.

[11] Patent Number: 6,087,249
[45] Date of Patent: Jul. 11, 2000

[54] TRANSISTOR FABRICATION PROCESS EMPLOYING A COMMON CHAMBER FOR GATE OXIDE AND GATE CONDUCTOR FORMATION

[75] Inventors: Mark I. Gardner, Cedar Creek; Fred N. Hause, Austin, both of Tex.

[73] Assignee: Advanced Micro Devices, Inc., Sunnyvale, Calif.

[21] Appl. No.: 09/151,075

[22] Filed: Sep. 10, 1998

Related U.S. Application Data

[62] Division of application No. 08/832,943, Apr. 7, 1997, Pat. No. 5,891,793.

[51] Int. Cl.[7] .............................................. H01L 21/3205
[52] U.S. Cl. .......................... 438/585; 438/586; 438/588; 438/591; 438/907; 438/908; 438/763; 438/764; 438/778; 438/788; 438/792
[58] Field of Search ..................................... 438/585–592, 438/907, 908, 763, 764, 778, 788, 792

[56] References Cited

U.S. PATENT DOCUMENTS

| | | |
|---|---|---|
| 4,281,031 | 7/1981 | Hillman et al. . |
| 4,789,645 | 12/1988 | Calviello et al. . |
| 4,859,617 | 8/1989 | Nomoto et al. . |
| 4,876,216 | 10/1989 | Tobias et al. . |
| 4,951,601 | 8/1990 | Mayden et al. . |
| 5,426,076 | 6/1995 | Moghadam . |
| 5,433,794 | 7/1995 | Fazan et al. . |
| 5,445,989 | 8/1995 | Lur et al. . |
| 5,498,577 | 3/1996 | Fulford, Jr. et al. . |
| 5,498,578 | 3/1996 | Steele et al. . |
| 5,589,233 | 12/1996 | Law et al. . |
| 5,609,737 | 3/1997 | Fukui et al. . |
| 5,652,166 | 7/1997 | Sun et al. . |
| 5,696,019 | 12/1997 | Chang . |
| 5,804,471 | 9/1998 | Yamazaki et al. . |
| 5,904,542 | 5/1999 | Gilmer et al. . |

FOREIGN PATENT DOCUMENTS 4-177735  6/1992  Japan .

OTHER PUBLICATIONS

High Technology Manufacturing . . . E L Hu, Emerging Technologies for In Situ Processing. Proceedings of the NATO Advanced Research Workshop, 1988, 1 page.

Primary Examiner—John F. Niebling
Assistant Examiner—Lynne A. Gurley
Attorney, Agent, or Firm—Conley, Rose & Tayon, P.C.; Robert C. Kowert

[57] ABSTRACT

An integrated circuit transistor is provided having a gate oxide and a gate conductor arranged upon a semiconductor topography, the gate oxide and gate conductor are formed within a common chamber. The initial semiconductor topography includes a silicon substrate having isolation regions disposed within its upper surface. The semiconductor topography may include an defined region, or well, doped opposite the substrate. The semiconductor topography is first placed in the common chamber. A separate chamber is operably placed gaseous communication with the common chamber. A plasma is created within the separate chamber, causing nitrogen, silicon, and oxygen containing compounds therein to form ions, molecular fragments, and excited molecules which are transported to the common chamber. The ions, molecular fragments, and excited molecules react and bombard the surface of the semiconductor topography to form an oxide layer thereon. The oxide layer is incorporated with nitrogen atoms which act as barrier atoms. Polysilicon is then deposited upon the oxide layer by CVD within the common chamber. The semiconductor topography is never exposed to ambient conditions outside the common chamber during and between the plasma oxide formation and the polysilicon deposition steps. Preventing ingress of outside ambient helps minimize contamination from entering the oxide. During the polysilicon deposition, dopant atoms are forwarded and become entrained within the polysilicon. The barrier atoms within the deposited oxide helps minimize dopant atoms from passing through the oxide and entering the channel below the oxide.

14 Claims, 4 Drawing Sheets ic circuit fabrication and,
TRANSISTOR FABRICATION PROCESS EMPLOYING A COMMON CHAMBER FOR GATE OXIDE AND GATE CONDUCTOR FORMATION This is application is a Divisional of U.S. Ser. No. 08/832,943, filed Apr. 7, 1997 now U.S. Pat. No. 5,891,793.

BACKGROUND OF THE INVENTION

1. Field of the Invention

This invention relates to integrated circuit fabrication and, more particularly, to the formation of a transistor utilizing a common chamber during the deposition of a gate dielectric upon a semiconductor topography followed by the deposition of a gate conductor layer upon the gate dielectric.

2. Description of the Relevant Art

Fabrication of a metal-oxide semiconductor ("MOS") transistor is well known in the art. The manufacture of an MOS transistor begins by defining active areas where the transistor will be formed. The active areas are isolated from other areas of the semiconductor topography by various isolation regions formed upon and within the topography. Isolation regions may be formed using various techniques. For example, the isolation regions can be formed by etching trenches into the topography and then filling the trenches with a dielectric fill material. Isolation regions may also be formed by locally oxidizing the silicon substrate using the well recognized local oxidation of silicon ("LOCOS") technique.

Once the isolation regions are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in an oxidation furnace or a rapid thermal anneal ("RTA") chamber. The gate conductor material is then deposited across the entire dielectric-covered substrate. The gate conductor material is preferably polycrystalline silicon, i.e., polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

An n-channel transistor, or NMOS transistor, is in most instances fabricated differently from a p-channel transistor, or PMOS transistor. NMOS transistors employ n-type dopants on opposite sides of the NMOS gate conductor, whereas PMOS transistors employ p-type dopants on opposite sides of the PMOS transistor gate conductor. The regions of the substrate which receive dopants on opposite sides of the gate conductor are generally referred to as junction regions, and the distance between junction regions is typically referred to as the physical channel length.

A complementary MOS, or CMOS transistor, contains both NMOS and PMOS transistors upon a single, monolithic substrate. Only one type of these two transistors can be fabricated on a given doped substrate portion. Thus, a CMOS substrate can accommodate a substrate portion ("well") of opposite dopant than the initially doped substrate. Generally, wells are the first regions formed within the substrate of a CMOS integrated circuit. A well is formed via implantation and diffusion of an appropriate dopant within a defined area of the substrate. It is important to connect p-type wells to the most negative circuit voltage and n-type wells to the most positive circuit voltage. Since either an NMOS or PMOS device must be located in the well, there has been some differences as to which type of well to use in CMOS fabrication.

It is critical to maintain uniform and stable threshold voltages of MOS transistors. For example, having a stable threshold voltage $V_T$ is important in any semiconductor device. For example, a sense amplifier is a balanced flip-flop whose voltage-sensing capability is directly related to the threshold voltage variation between transistors within the amplifier. In CMOS circuits, it is desirable that the n- and p-channel devices have similar threshold magnitudes for optimal performance. Moreover, threshold voltages should be as small as possible in order for a CMOS circuit to have maximum current-driving capability. The minimum threshold voltage, however, needs to be at a value which prevents excessive subthreshold currents.

Polysilicon gate structures in CMOS devices are often doped to reduce their resistivities. It is ideal to use an n-type polysilicon gate for NMOS devices and a p-type polysilicon gate for PMOS devices in order to achieve low threshold voltages for both devices of a CMOS transistor. It is common to highly dope one gate conductor while covering the other gate conductor with a mask, thereby preventing the other gate conductor from becoming doped. Then the other gate conductor is doped at a lessor concentration than the initially doped gate conductor. The heavily doped gate conductor requires no mask during the doping of the other gate conductor since it bears a high concentration of one dopant and therefore cannot be effectively doped with another dopant. When a heavily doped polysilicon gate conductor is subjected to high temperature treatment, the dopants therein can migrate through the dielectric layer and into the oppositely doped channel. This allows the channel to be counterdoped by dopants from the gate conductor. This counterdoping can occur to the degree that the threshold voltage is deleteriously changed from its pre-designed value.

The gate dielectric in CMOS transistors is typically a thermally grown oxide. Since the drain current of the transistor is inversely proportional to the gate-oxide thickness, the gate oxide is normally made as thin as possible. In order to deposit polysilicon onto the gate oxide by CVD, the device is moved to a CVD chamber. Conventional CVD systems include the following components: gas sources; gas feed lines; mass-flow controllers for entering gases; a reaction chamber; a thermal energy source for heating wafers placed within the chamber; temperature sensors; and pumps for reducing chamber pressure and exhausting the gases from the chamber. Withdrawal of the oxide covered substrate from the CVD chamber allows native oxides or other impurities to grow or deposit upon the gate oxide. Contamination may produce charge trap locations in the gate oxide which can alter, for example, breakdown and threshold voltages of the device. Furthermore, the formation of a native oxide layer upon the gate oxide can negatively impact the source-to-drain current of the device.

It is therefore desirable to devise a CMOS device fabrication method in which the gate dielectric does not become exposed to ambient conditions before the deposition of polysilicon upon the gate dielectric. Prevention of exposure of the gate dielectric to ambient oxygen is beneficial in that the gate oxide remains at a controlled thickness with minimal contamination. Moreover, the desired method must be one which does not allow dopants within the gate conductor (normally heavy doped in a CMOS process flow) to migrate into the underlying channel. Such a method would help prevent threshold voltages skews from their favored values.

SUMMARY OF THE INVENTION

The problems outlined above are in large part solved by the transistor fabrication process of the present invention. That is, a process is provided which involves forming a gate dielectric upon a semiconductor topography and subsequently depositing a gate conductor material upon the gate dielectric without exposing the device to ambient conditions in the interim. In the process hereof, the gate dielectric may be deposited instead of grown. Deposition occurs in a nitrogen ambient such that nitrogen barrier atoms become scattered throughout the gate dielectric to prevent dopant atoms within the overlying gate conductor from passing into a channel directly below the gate dielectric. Thus, the threshold voltage does not skew since counterdoping of the channel is substantially minimized.

In an embodiment of the present invention, a single crystalline substrate is provided which has isolation regions spaced therein. The substrate is placed in a first chamber which is connected to a second chamber by a conduit. The second chamber is downstream from the first chamber and contains an electrode. A valve is is located within the connecting conduit of the two chambers. A gate dielectric, preferably an oxide layer, is formed upon the substrate using a plasma deposition. A radio-frequency electric field is created within the second chamber which has silicon/nitrogen/oxygen containing compounds. Due to the electric field, these compounds become ionized, fragmented, or excited, forming a plasma. These ions, fragments, and excited molecules are then transported upstream to the first chamber where they react and bombard the substrate therein, forming a layer of oxide with nitrogen incorporated therein. During the plasma deposition, the two-chamber system is maintained at a temperature between 50° C. and 400° C.

A layer of polysilicon is deposited upon the gate dielectric retained in the first chamber. The first chamber remains closed during the interim so the gate oxide is never exposed to conditions outside of the chamber during, and in the interval between, gate dielectric and polysilicon deposition. Dopant atoms are preferably incorporated into the polysilicon as it is formed. The formation of the gate conductor is completed by etching away areas of the gate dielectric layer and the polysilicon layer exclusive of the gate conductor.

The present invention exhibits advantageous features compared to conventional methods of transistor fabrication. A single chamber is used to perform both dielectric oxide formation and polysilicon deposition needed for an ensuing gate conductor dielectrically disposed over a channel area. The single chamber is not opened during the interim between the formation of these two layers. Thus, the oxide layer is prevented from being exposed to ambient oxygen and other impurities. The pre-established oxide layer thickness is maintained at the same thickness, preventing an increase in threshold voltage, decrease in device speed, and/or a decrease in source-to-drain current. In addition to oxide thickness control, nitrogen can be incorporated into the oxide deposition pattern. The nitrogen atoms are located where vacancies in the oxide layer would have otherwise existed. Nitrogen is highly mobile and substantially fills diffusion avenues, thus lessening the diffusion lengths of dopant atoms within the heavily doped polysilicon. The nitrogen/oxide layer is formed at relatively low temperatures, allowing nitrogen to fill diffusion paths within the gate dielectric yet not allowing sufficient temperature to diffuse substantially through the gate dielectric and into the channel area. Since nitrogen helps prevent dopants from migrating through the oxide layer and into the channel area, the channel area is protected from the aforesaid counterdoping problems.

BRIEF DESCRIPTION OF THE DRAWINGS

Other objects and advantages of the invention will become apparent upon reading the following detailed description and upon reference to the accompanying drawings in which:

FIG. 5b is a partial cross-sectional view of the semiconductor topography, wherein the dielectric material and the polysilicon are removed in areas exclusive of the gate conductor being formed, subsequent the step in FIG. 5a;

FIG. 6b is a partial cross-sectional view of the semiconductor topography, wherein the dielectric material and the polysilicon are removed in areas exclusive of the gate conductor being formed, subsequent the step in FIG. 6a.

Figure 1:
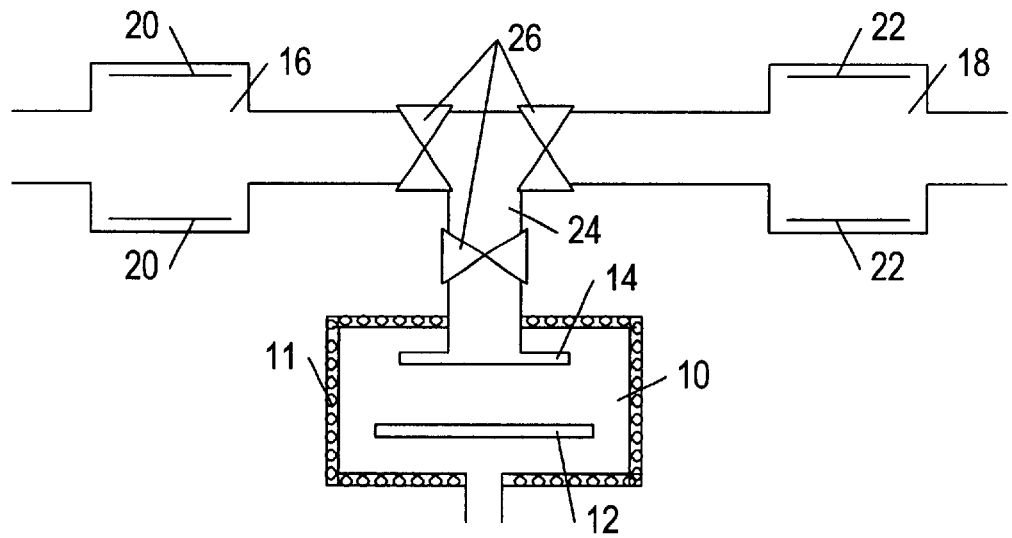
FIG. 1 is a partial plan view of a system used for depositing, in situ, a gate dielectric upon a semiconductor topography, followed by a gate conductor upon the gate dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 depicts a portion of a system used to form a gate dielectric and overlying polysilion. Chamber 10 is preferably a CVD chamber in which both a dielectric layer and a polysilicon layer are deposited in series. The layered topography can then be selectively patterned to form a transistor gate conductor. Plate 12 includes a staging area on which semiconductor wafers may be placed for processing within chamber 10. A shower head 14 may be located above plate 12 to disperse incoming gas across the topography of one or more wafers. Chamber 10 preferably has heating capabilities provided by heating coils 11. Chambers 16 and 18 are configured to allow gaseous communication with chamber 10 via conduit 24. Valves 26 may be opened to allow gas to flow between chambers, or a particular valve 26 may be closed to isolate a particular chamber. Chamber 16 depicts electrodes 20, and chamber 18 depicts electrodes 22. When charged, electrodes 20 and 22 cause gas within chamber 16 or chamber 18 to form a plasma. A plasma formed within these chambers may be forwarded to chamber 10 to form a layer upon wafers occupying plate 12. In one embodiment, chamber 16 is a source of an oxide plasma while chamber 18 is a source of a dopant implant, or vice versa.

Figure 2:
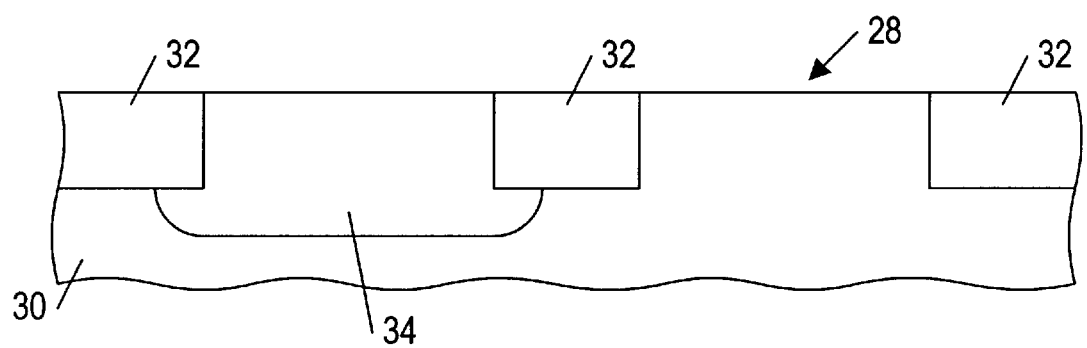
FIG. 2 is a partial cross-sectional view of a semiconductor topography having isolation regions spaced from each other within a silicon-based substrate.

FIG. 2 illustrates an embodiment of the initial semiconductor topography 28 provided for the present invention. Semiconductor topography 28 preferably includes a substrate 30 containing single crystalline silicon. Semiconductor topography 28 has isolation regions 32 spaced apart from each other within the upper surface of substrate 30. Substrate 30 is preferably doped with either p-type dopants or n-type dopants. Some commonly used p-type dopants are boron or boron difluoride, and some commonly used n-type dopants are arsenic or phosphorus. Since a CMOS transistor includes both an n-type channel region and a p-type channel region, semiconductor topography 28 further has a well 34 located between two adjacent isolation regions 32. Well 34 preferably contains dopants which are opposite the type found in substrate 30 to create a potential for two different dopant-types of channels for accommodating NMOS and PMOS devices.

Figure 3:
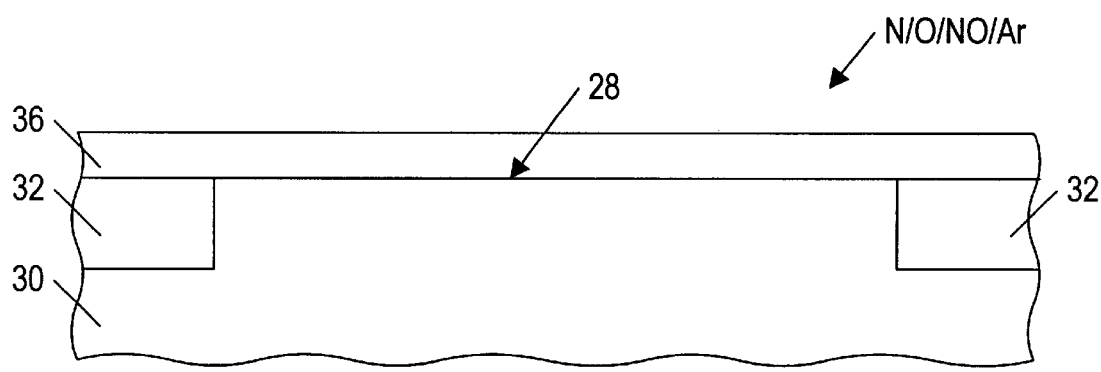
FIG. 3 is a partial cross-sectional view of the semiconductor topography, wherein a dielectric layer, incorporated with nitrogen atoms, is deposited upon the semiconductor topography according to a first embodiment bearing a first deposition step of an in situ, dual deposition sequence.

FIG. 3 depicts a portion of semiconductor topography 28. An oxide layer 36 incorporated with nitrogen atoms is preferably deposited upon the surface of semiconductor topography 28. The deposition of oxide layer 36 is one which occurs from chamber 16 (shown in FIG. 1), according to one embodiment. In one instance, nitrogen, oxygen, and silicon containing gaseous compounds, e.g., $N_2O$, NO, and $SiH_4$ pass into chamber 16. A radio-frequency electric field is formed at electrodes 20 which transfers energy into the gas which is held at a low pressure. Plasma formation within the gas begins with free electrons being stripped from the gas molecules using the applied field. The stripped electrons are then accelerated by the applied field, and they collide with the gas molecules. The collisions cause the molecules to ionize, break down into ionized and unionized fragments, and enter an excited state. An inert species such as argon may be present in chamber 16. The inert species helps transport the ionized, fragmented, and excited molecules to chamber 10 where semiconductor topography 28 is disposed upon plate 12.

The ions, molecular fragments, and excited molecules are all highly reactive, so as they bombard semiconductor topography 28, they form silicon dioxide ("oxide") as well as compounds containing nitrogen and oxygen bonds. The temperature of chamber 10 is preferably heated between 50° C. and 400° C. to aid the reactions; however, the desired reactions can also occur at room temperature since the molecules and ions are already energized. These newly formed compounds form a solid layer on the surface of semiconductor topography 28. The resulting oxide layer 36 adheres relatively well to semiconductor topography 28 by forming bonds between available atoms at the oxide layer 36/semiconductor topography 28 interface. For example, an available silicon atom of substrate 30 may bond to an available oxygen atom of layer 36.

Figure 4:
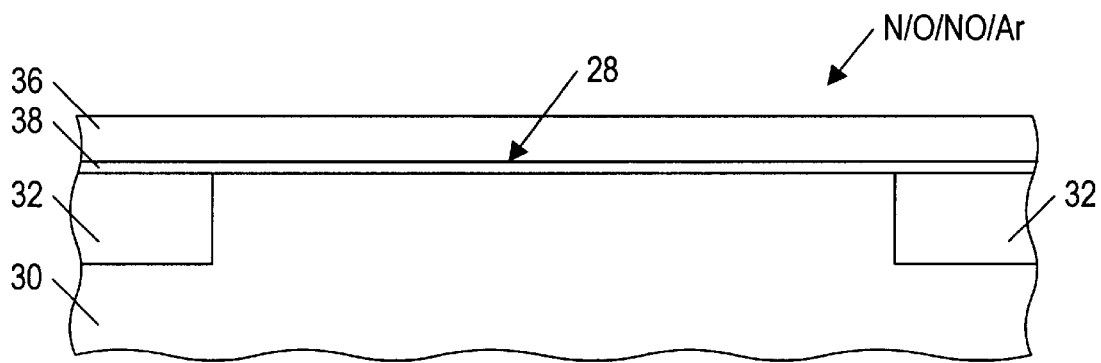
FIG. 4 is a partial cross-sectional view of the semiconductor topography, wherein a dielectric layer is grown upon the semiconductor topography and thereafter a dielectric layer is deposited according to a second embodiment bearing a first deposition step of an, in situ, dual deposition sequence.

FIG. 4 illustrates an alternate embodiment to that shown in FIG. 3. Specifically, FIG. 4 depicts a semiconductor topography 28 preconditioned with a thin oxide layer 38. This oxide layer 38 is formed upon substrate 30 and isolation regions 32 via thermal growth, or LPCVD deposition. A plasma oxide layer 36 incorporated with nitrogen atoms is disposed upon oxide layer 38 in the same manner as that which oxide 36 is deposited in FIG. 3. Bonding preferably occurs between atoms at the layer 38/layer 36 interface. The addition of a thermally grown oxide at the plasma/substrate interface helps maintain nitrogen atoms from being located near the channel surface (i.e., surface of substrate 30 between isolation regions 32). The nitrogen atoms thusly placed provide a more optimal diffusion barrier.

Figure 5A:
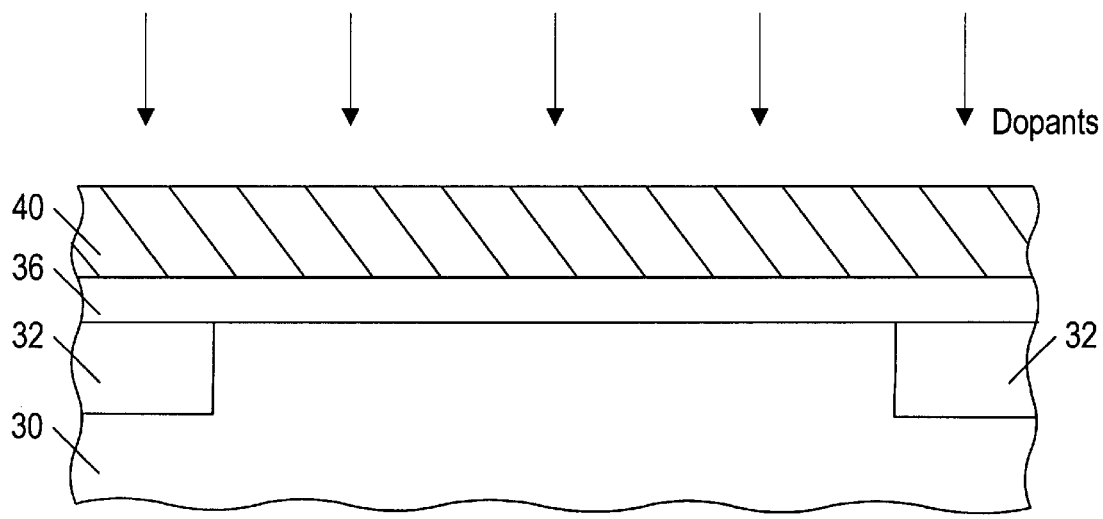
FIG. 5a is a partial cross-sectional view of the semiconductor topography, wherein polysilicon is deposited upon the dielectric layer and dopant atoms are forwarded to the polysilicon layer, subsequent the step in FIG. 3.

FIG. 5*a* illustrates further processing steps, subsequent to the step in FIG. 3. Polysilicon 40 is formed upon oxide layer 36 by CVD. As the polysilicon is being deposited, dopant atoms are preferably forwarded to the polysilicon. Polysilicon layer 40 is formed having dopant atoms, such as arsenic, phosphorous, boron, or boron difluoride entrained therein. In one embodiment, dopant atoms pass from chamber 18 to chamber 10 where they are forwarded downward from shower head 14. This prevents oxide layer 36 from becoming exposed to ambient oxygen and other contaminants which might adversely affect the operation of the transistor.

Figure 5B:
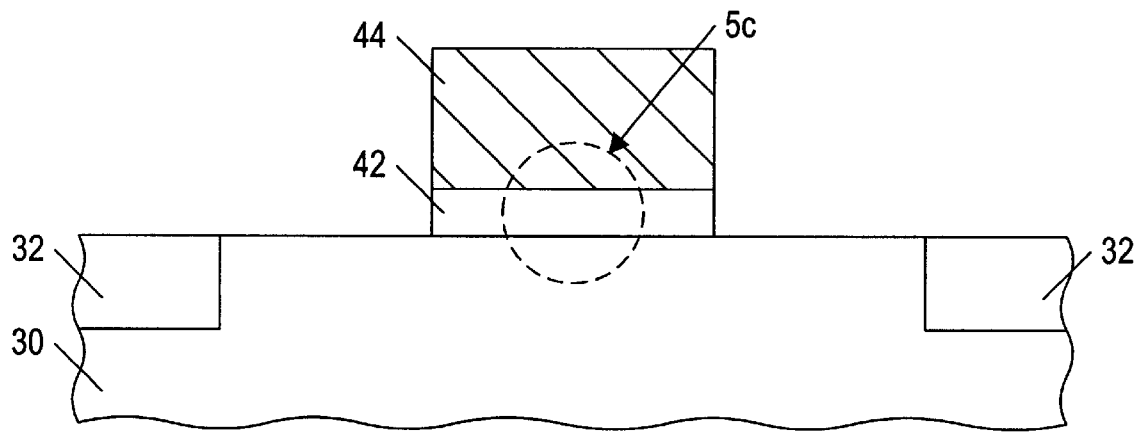
Figure 5C:
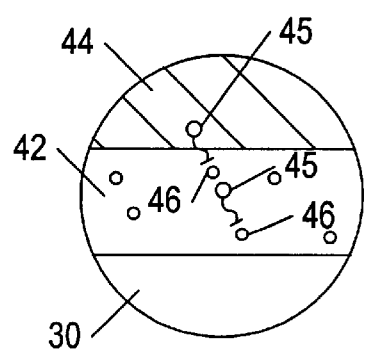
FIG. 5c is a detailed view along section 5c of FIG. 5b, wherein nitrogen atoms are arranged throughout the dielectric layer to minimize migration of overlying dopants therethrough.

FIG. 5*b* illustrates the formation of a gate oxide 42 and a gate conductor 44 upon substrate 30. The gate structure is formed using photoresist, optical lithography, and select etch of oxide layer 36 and polysilicon layer 40 (shown in FIG. 5*a*) exclusive of the area where gate conductor 44 and gate oxide 42 are patterned. FIG. 5*c* shows a detailed view of region 5*c* of FIG. 5*b*. Nitrogen atoms 46 are arranged throughout oxide layer 42, and they act as barrier atoms. The nitrogen atoms 46 preferably occupy a substantial portion of the vacancies that would have existed within oxide layer 42 if there had been no nitrogen incorporation. Nitrogen atoms 46 preferably exist in substitutional, interstitional diffusion avenues and along grain boundaries of oxide layer 42. It is believed nitrogen atoms 46 occupy a substantial portion of the migration avenues, thereby lessening the diffusion lengths (or paths) of dopants 45 arising from polysilicon 44, as shown. Furthermore, any dopant atoms 45 which pass through the grain-boundaries cannot move farther downward into substrate 30 since nitrogen atoms 46, oxygen atoms, and silicon atoms, prevail within oxide 42 and especially at the interface between oxide 42 and substrate 30. Minimal vacancies within oxide layer 42 exist which dopant atoms can substitute for, or between which dopants atoms 45 can pass. It is therefore postulated that a negligible amount of dopant atoms 45 reach the critical channel area of substrate 30 dielectrically spaced below gate conductor 44.

Figure 6A:
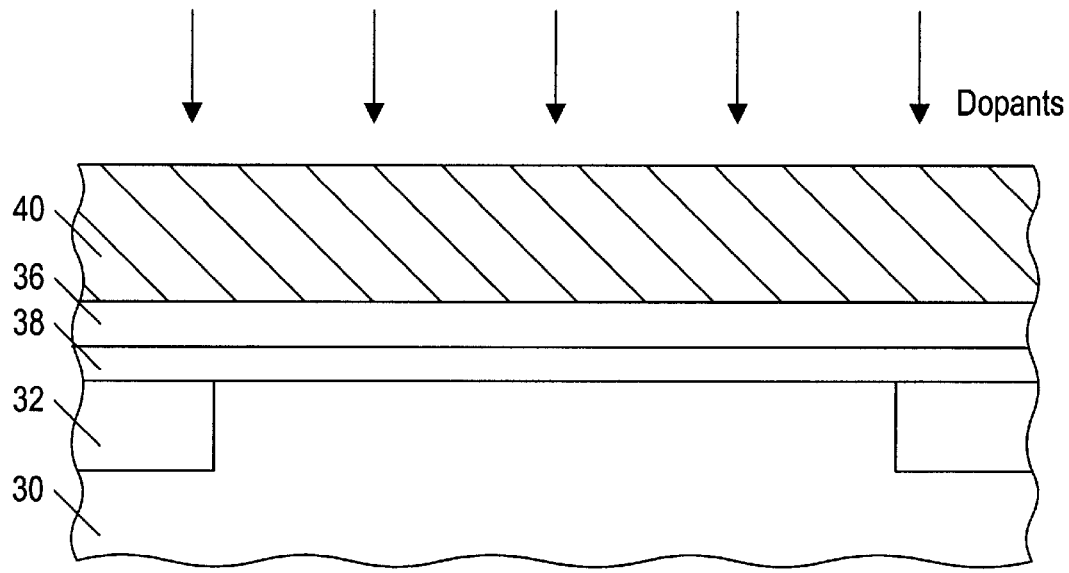
FIG. 6a is a partial cross-sectional view of the semiconductor topography, wherein polysilicon is deposited upon the dielectric layer and dopant atoms are forwarded to the polysilicon layer, subsequent the step in FIG. 4.
Figure 6B:
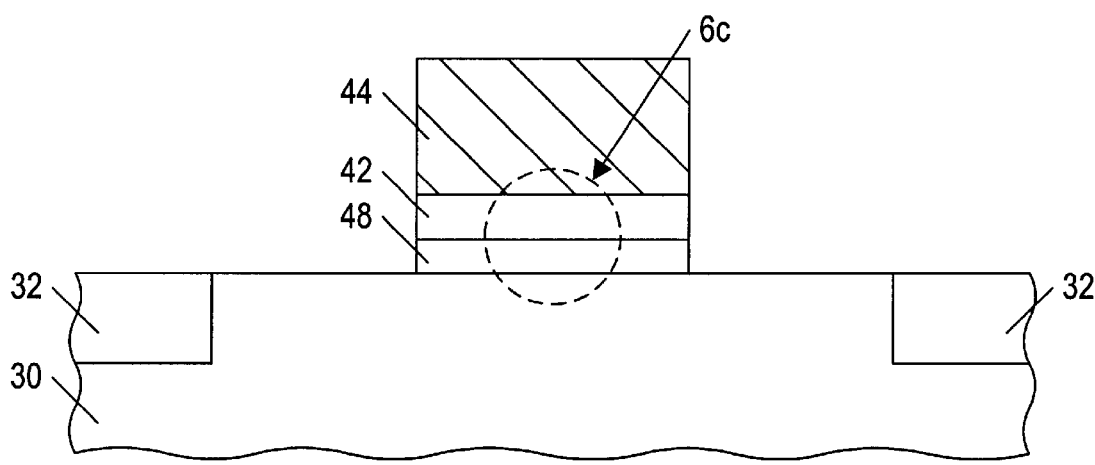
Figure 6C:
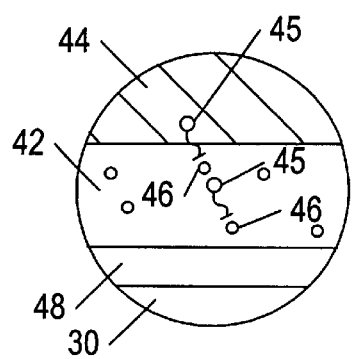
FIG. 6c is a detailed view along section 6c of FIG. 6b, wherein nitrogen atoms are arranged throughout the dielectric layer to minimize migration of overlying dopants therethrough.

FIGS. 6*a* and 6*b* illustrate alternate processing steps to that shown in FIGS. 5*a* and 5*b*. The step of FIG. 6*a* occurs subsequent to that shown in FIG. 4. Thus, the thin oxide layer 38 exists between substrate 30 and oxide layer 36, and portions of thin layer 38 (along with oxide 36 and polysilicon 40) are etched away to form a thin gate oxide layer 48 underneath gate oxide 42 (shown in FIG. 6*b*). FIG. 6*c* shows in more detail region 6*c* of FIG. 6*b*. Thin gate oxide layer 48 keeps nitrogen atoms 46 from being proximate the channel region of substrate 30. This is desirable because if nitrogen atoms are near the channel, they may migrate therein during later heat treatments. If nitrogen atoms are able to leave gate oxide 42, vacancies and grain-boundary diffusion paths would become available through which dopants 45 might migrate. Dopant atoms 45 are therefore substantially held either within polysilicon 44 or within the upper regions of the gate dielectric (i.e., within oxide 42 rather than oxide 48 arranged below oxide 42). The existence of thin gate oxide layer 48 helps provide barrier protection and, more particulary, separation between barrier atoms and the underlying channel.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming a transistor, comprising:

providing a semiconductor topography in a first chamber;

passing a gas into a second chamber;

forming a plasma of said gas in said second chamber;

forwarding said plasma into said first chamber to form a dielectric layer upon said semiconductor topography; and while maintaining said semiconductor topography within said first chamber, depositing a polysilicon layer upon said dielectric layer.

2. The method as recited in claim 1, further comprising forwarding dopant atoms from a third chamber to said first chamber during said depositing, wherein said polysilicon layer is doped with said dopant atoms.

3. The method as recited in claim 1, further comprising removing areas of said dielectric layer and said polysilicon layer to form a gate dielectric and a gate conductor.

4. The method as recited in claim 1, wherein said forwarding comprises opening at least one valve separating said first chamber from said second chamber.

5. The method as recited in claim 1, further comprising maintaining said first chamber closed during the interim between said forwarding and said depositing to prevent said dielectric layer form being exposed to conditions outside said first chamber during said interim.

6. The method as recited in claim 2, further comprising closing at least one valve to isolate said first chamber from said second and third chambers.

7. The method as recited in claim 1, wherein said passing a gas comprises passing nitrogen and oxygen gaseous compounds into said second chamber.

8. The method as recited in claim 1, wherein said passing a gas comprises passing $N_2O$, $NO$, and $SiH_4$ into said second chamber.

9. The method as recited in claim 1, wherein said forwarding said plasma comprises providing an inert species in said second chamber for transporting said plasma to said first chamber.

10. The method as recited in claim 9, wherein said inert species comprises argon.

11. The method as recited in claim 1, further comprising pre-conditioning said semiconductor topography with an oxide layer prior to said forwarding, wherein said dielectric layer is formed upon said oxide layer.

12. The method as recited in claim 11, wherein said pre-conditioning comprises forming said oxide layer by thermal growth or LPCVD deposition.

13. The method as recited in claim 11, further comprising:

incorporating nitrogen atoms in said dielectric layer;

removing areas of said polysilicon layer, said dielectric layer and said oxide layer to form a gate structure comprising a gate conductor, a nitrogen bearing gate dielectric and a gate oxide.

14. The method as recited in claim 1, further comprising maintaining said first chamber at a temperature ranging from approximately 20° C. to approximately 400° C. during said forwarding.

* * * * *